United States Patent
Renaud-Bezot (10) Patent No.: US 9,929,101 B2
(45) Date of Patent: Mar. 27, 2018

(54) ELECTRONIC ASSEMBLY COMPRISING A CARRIER STRUCTURE MADE FROM A PRINTED CIRCUIT BOARD

(71) Applicant: AT & S Austria Technologie & Systemtechnik Aktiengesellschaft, Leoben (AT)

(72) Inventor: Nick Renaud-Bezot, Leoben (AT)

(73) Assignee: AT & S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 15/307,549

(22) PCT Filed: Apr. 28, 2015

(86) PCT No.: PCT/EP2015/059175
§ 371 (c)(1),
(2) Date: Oct. 28, 2016

(87) PCT Pub. No.: WO2015/165889
PCT Pub. Date: Nov. 5, 2015

(65) Prior Publication Data
US 2017/0053874 A1 Feb. 23, 2017

(30) Foreign Application Priority Data
Apr. 28, 2014 (EP) .................... 14290124

(51) Int. Cl.
*H01L 23/48* (2006.01)
*H01L 29/40* (2006.01)
(Continued)

(52) U.S. Cl.
CPC ...... *H01L 23/5389* (2013.01); *H01L 21/4857* (2013.01); *H01L 21/52* (2013.01);
(Continued)

(58) Field of Classification Search
CPC .......... H01L 23/5389; H01L 23/49816; H01L 23/49838; H01L 21/4853; H01L 23/49811;
(Continued)

(56) References Cited

U.S. PATENT DOCUMENTS

2005/0006739 A1 1/2005 Gregory et al.
2007/0164409 A1 7/2007 Holland
(Continued)

FOREIGN PATENT DOCUMENTS

CN 201887040 U 6/2011
EP 1 478 023 A1 11/2004
(Continued)

*Primary Examiner* — Theresa T Doan
(74) *Attorney, Agent, or Firm* — Robert A. Blaha; Smith Tempel Blaha LLC (57) ABSTRACT

An electronic assembly includes (a) a base carrier structure having a cavity formed therein, (b) a cover carrier structure, and (c) an electronic component disposed within the cavity and connected electrically and/or thermally both with the cover carrier structure and with the base carrier structure. The base carrier structure is made at least partially from a printed circuit board. Preferably, also the cover carrier structure is made at least partially from a further printed circuit board. A method for manufacturing such an electronic assembly is also described.

17 Claims, 4 Drawing Sheets (51) Int. Cl.
  *H01L 23/538* (2006.01)
  *H01L 23/498* (2006.01)
  *H01L 21/48* (2006.01)
  *H01L 21/52* (2006.01)
  *H01L 23/31* (2006.01)

(52) U.S. Cl.
  CPC .... *H01L 23/3178* (2013.01); *H01L 23/49811* (2013.01); *H01L 23/49822* (2013.01); *H01L 23/49833* (2013.01); *H01L 2224/16225* (2013.01); *H01L 2224/73253* (2013.01)

(58) Field of Classification Search
  CPC ......... H01L 23/49833; H01L 21/76831; H01L 23/52; H01L 21/4857
  USPC ...................................................... 257/773
  See application file for complete search history.

(56) References Cited

U.S. PATENT DOCUMENTS

2008/0157330 A1    7/2008  Kroenhert et al.
2012/0081864 A1*   4/2012  Sakurai ............. H01L 23/49822
                                                              361/753

FOREIGN PATENT DOCUMENTS

EP        2 469 592 A1   6/2012
WO   WO 2005048311 A2    5/2005

* cited by examiner

ELECTRONIC ASSEMBLY COMPRISING A CARRIER STRUCTURE MADE FROM A PRINTED CIRCUIT BOARD

CROSS-REFERENCE TO RELATED APPLICATIONS

This application is a U.S. national phase patent application of PCT/EP2015/059175 which claims the benefit of the filing date of European Patent Application No. 14290124.8, filed on Apr. 28, 2014, the disclosures of which are hereby incorporated herein by reference in their entirety.

TECHNICAL FIELD

Embodiments of the present invention generally relate to the technical field of electronic components. In particular, the present invention relates to an electronic assembly or package comprising a mechanically protected and electrically connected electronic component, in particular a semiconductor component or die. The present invention further relates to an electronic device comprising such an electronic assembly and to a method for manufacturing such an electronic assembly.

TECHNOLOGICAL BACKGROUND

The function of an electronic package is to protect sensitive electronic components, in particular integrated semiconductor circuits, from harsh environments without inhibiting the electrical performance. The package is used to electrically and mechanically attach the respective electronic component to an intended electronic device or apparatus.

One popular family of electronic packages is the so called Micro Leadframe Package (MLP) also known as Quad-Flat-No-Lead (QFN) or Dual-Flat-No-Lead (DFN). MLP is based upon a patterned and etched metal mounting commonly with a central pad, onto which at least one electronic component is mounted, connected with wire bonds to isolated package pins, and then encapsulated by a plastic sealing material. The sealing material is applied around the metal of the mounting and the electronic component with the wire bonds to form a hard, protective plastic body.

In the electronic packaging industry there is a permanent desire on the one hand to reduce size and cost and on the other hand to increase the integrated functionality. One proven route to increase functionality is to include several integrated circuits in the same MLP.

Modern assembly techniques allow semiconductor dies to be stacked or flip mounted (i.e. mounted in an inverted orientation) known as "flip-chip" mounting. Thereby, the final package size can be kept small.

A further problem to be solved in the electronic packaging industry is the dissipation of unwanted thermal energy, which is produced by the packaged electronic component during normal operation. Therefore, an intelligent thermal design is also important in order to allow the maintenance of electrical and mechanical stability of the packaged component.

Another problem to be solved is that many electronics products need to operate in an electrically noisy environment. Therefore, measures for protecting a sensitive integrated circuit within the package from unwanted electrical interference in important in many applications.

Figure 4:
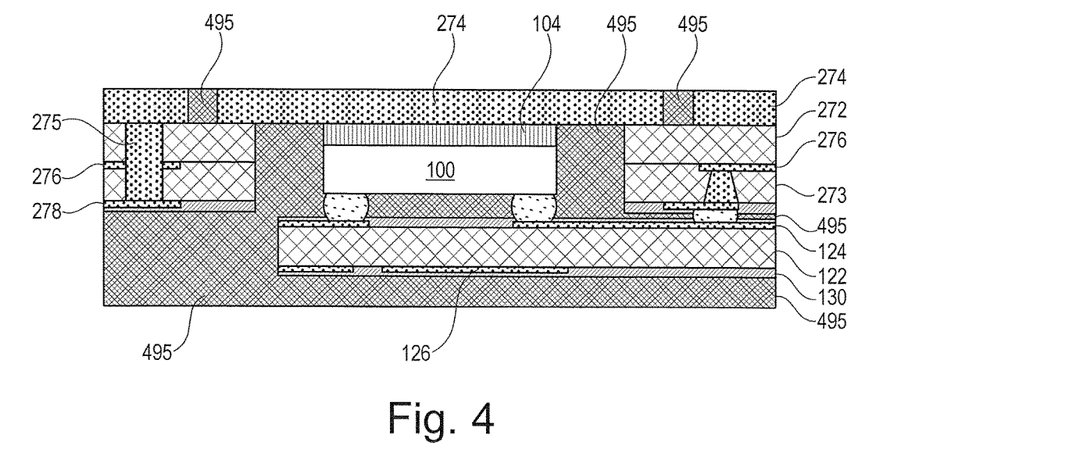

EP 2 469 592 A1 discloses with FIG. 4 an integrated circuit chip package device comprising (a) a package base 30 with a cavity 40 formed therein, (b) a semiconductor die 20 being located in the cavity 40, and (c) a planar dielectric substrate 10 representing a cover for the package base 30 respectively for the semiconductor die 20. The semiconductor die 20 is electrically connected to conductor traces being formed at the surface of the dielectric substrate 10 by means of flip chip balls 50. The semiconductor die 20 mechanically and thermally connected to a center die pad 31 on the surface of the package base 30 by means of an adhesive layer 25.

SUMMARY

There may be a need for packaging an electronic component within a carrier structure, wherein both (a) a high electrical performance and (b) a good thermal connection between the electronic component and a heat sink outside from the electronic package is ensured.

This need may be met by the subject matter according to the independent claims. Advantageous embodiments of the present invention are described by the dependent claims.

According to a first aspect of the invention there is provided an electronic assembly comprising (a) a base carrier structure having a cavity formed therein, (b) a cover carrier structure, and (c) an electronic component being disposed within the cavity and being connected electrically and/or thermally both with the cover carrier structure and with the base carrier structure. In accordance with this aspect of the invention the base carrier structure is made at least partially from a printed circuit board.

TECHNICAL OVERVIEW

The described electronic assembly is based on the idea that an electronic package comprising an electronic component, in particular a semiconductor electronic component, can be realized in an efficient manner by using a known printed circuit board (PCB) respectively PCB technology. When using at least one PCB all processing techniques which are already available for PCBs and for all the materials being used for PCB technology can be employed for realizing the described electronic assembly.

Specifically, PCBs allow for an increased routing capability as compared to known substrate materials being used for interconnecting and packaging in particular highly integrated electronic components. This may allow for a significantly increase of the design flexibility and/or for an increased electrical performance.

Further, PCBs can be processed with comparatively simple and limited tooling equipment. Therefore, when designing a new electronic assembly there are comparatively small Non Returning Engineering costs. As a consequence, even electronic assemblies with a short production cycle can be produced with a significant (positive) return of investment.

The term(s) "base carrier structure" and/or "cover carrier structure" may refer to any spatial physical structure which is able to mechanically support and/or to provide electric connection for an electronic component. For electric connections there may be used conductor paths of various sizes for providing an appropriate wiring or connection structure.

For realizing the described electronic assembly (a) appropriate spatial PCB structures providing a mechanical support together with (b) appropriate wiring paths providing an electric connection can be used. As a consequence, the described electronic assembly can be realized in an efficient manner without requiring a metallic lead frame structure.

In the context of the present application, a "printed circuit board" may denote a particularly plate shaped body which has an electrically insulating core and electrically conductive structures at or on at least one surface. Such a printed circuit board (PCB) may serve as a basis for mounting electronic members thereon and/or therein and serves both as a mechanical support platform and as an electrically wiring arrangement comprising appropriate conductor paths for electrically and/or for thermally connecting the electronic component being arranged within the cavity. The "printed circuit board" may also be denoted a "conductor board" or simply a "circuit board". The "printed circuit board" may be a mechanically stiff structure, which provides a more or less rigid support for the electronic component. Alternatively, the "printed circuit board" may comprise a certain flexibility. This flexibility may be given over the whole surface area of the "printed circuit board" or may be given only within predetermined surface portions of the "printed circuit board". In particular, a PCB may be a so called "finished PCB". This means that for producing the described electronic assembly the PCB or the PCBs being used have already finished their production and represents respectively represent a semi-finished part for the production of the described electronic assembly. Specifically, the PCB or the PCBs being used have already completed their PCB production process where an electrically conductive structure or layer has been applied to at least one surface of an electrically insulating core. Such a production process may also include a structuring and/or patterning of the electrically conductive layer, which structuring and/or patterning is carried out in a known and suitable manner in order to provide appropriate conductor paths and/or connection pads.

In the context of the present application the term "connected thermally" may include all forms of thermal coupling. Specifically, the term "connected thermally" may mean that there is provided a thermal path with a comparatively high thermal conductivity, which thermal path can be used in particular to transport heat being generated by the electronic component during operation towards a heat sink. However, the term "connected thermally" may also mean that there is (by accident) a thermal contact, which could be also very small. Such a thermal contact may be generated by means of any material, which can be used to package the electronic component from the respective side for instance in order to provide a suitable protection for the electronic component from its environment.

In the context of the present application the term "cavity" may mean an at least partially closed zone, which defines a region being suitable for accommodating an electronic component. In a cross sectional view a cavity may be defined by at least two side walls. In 3D reality a cavity may be defined by at least three sidewalls. Apart from accommodating the electronic component the space within the cavity may be unfilled or may be filled with any material.

According to an embodiment of the invention the printed circuit board is a circuit board comprising at least one dielectric layer and at least one structured metallic plane for thermally connecting the electronic component. This may provide the advantage that the metallic plane respectively a corresponding metallic layer can be designed in a flexible manner such that for different applications appropriate structure pattern can be used. Specifically, the structured metallic plane can be designed such that an appropriate thermal conductivity is provided which may be necessary for dissipating heat being generated when the electronic component is in operation.

The described cavity accommodating the electronic component may be formed in particular within the dielectric layer.

According to a further embodiment of the invention the at least one structured metallic plane is further configured for electrically connecting the electronic component. This may provide the advantage that an electric connection of the electronic component can be achieved via two opposing sides of the electronic component.

According to a further embodiment of the invention (a) a first portion of the structured metallic plane is configured for thermally connecting the electronic component and (b) a second portion of the structured metallic plane is configured for electrically connecting at least one external electronic component.

The external electronic component may be in particular an electronic component which is located outside from the described electronic assembly. The at least one external electronic component may be assigned to a main board or a mother board onto which the described electronic assembly can be placed.

The described structuring of the metallic plane may provide the advantage that it can be used for different purposes. Thereby, different portions of the structured metallic plane can be designed or formed differently. Specifically, a physical property of a portion can be selected such that the structured metallic plane is optimized with respect to different requirements. For instance, a first thickness of the structured metallic plane within the first portion may be larger than a second thickness of the structured metallic plane within the second portion in order to provide a necessary thermal conductivity.

According to an embodiment of the invention the cover carrier structure is made at least partially from a further printed circuit board. This may provide the advantage that the electronic component can also mechanically and/or electrically be connected to the cover carrier structure by means of known and comparatively simple PCB tooling.

According to a further embodiment of the invention the printed circuit board and/or the further printed circuit board is a circuit board comprising at least two more or less structured metallic planes and at least one dielectric layer being formed between two neighboring metallic planes.

Preferably, the printed circuit board and/or the further printed circuit board may be a so called multilayer circuit board comprising at least three more or less structured metallic planes and at least two dielectric layers each being formed between two neighboring metallic planes.

A dielectric layer may be made from different materials such as e.g. (a) a phenolic resin together with paper or cardboard, (b) an epoxy resin together with paper or cardboard, and (c) an epoxy resin together with fiber glass reinforcement. With respect to fire retardant (FR) the materials (a) are called FR1 or FR2, the materials (b) are called FR3, and the materials (c) are called FR4 or FR5 materials. It is mentioned that for very sophisticated applications also other materials such as e.g. teflon, aluminum oxide, or a polyester foil (for flexible PCBs) can be used.

The dielectric layer or a laminate package may be made preferably from a material having a high glass transition temperature and/or a low coefficient of terminal expansion. Further, the electrically insulating layer may be formed at least partially from a prepreg material. Such a prepreg material may form at least partially an electrically insulating core of a glass fiber reinforced epoxy-based resin and may be shaped as a plate or sheet. Prepreg may be denoted as a glass fiber mat soaked by resin material and being used for an interference fit assembly for the manufacture of printed circuit boards. Further, the dielectric layer may be made from a printed polymer, a flex material or any other material, which is known in the field of PCBs for realizing an insulating layer between two neighboring metallic planes.

Using a multilayer PCB may provide the advantage that the electric wiring connection to and from the electronic component can be extended from the two dimensional surface of a single layer PCB at least partially into the third dimension perpendicular to the PCB surface. Thereby, if required, a highly sophisticated electric connection or wiring pattern may be realized. For connecting different regions, conductor paths and/or connection pads being located one upon the other in different metallic planes metallic studs and/or plated-through holes called vias may be used.

Descriptive speaking, thanks to multilayer routing capabilities complex multichip modules can be created easily without having to rely on a comparatively difficult wire bonding. This includes the possibility to mix high-current traces consisting of a thicker and/or wider metallic material with fine-pitch traces which are much thinner and are used for transporting only a comparatively small current.

According to a further embodiment of the invention the electronic assembly further comprises a filling material, which is located within the cavity.

Using an appropriate filling material may provide the advantage that a strong mechanical attachment of the electronic component within the cavity can be realized. Thereby, depending on the specific application, the filling material can surround or embed the electronic component completely or partially. Anyway, the filling material being provided within the cavity contributes to an increase of a shock resistance of the whole electronic assembly. As a consequence, the field of application for the electronic assembly will be widened in particular towards applications within a rough environment.

It is mentioned that an appropriate filling material can also be used for improving the thermal conductivity in particular between the electronic component and a heat sink being provided at the outer surface of the electronic assembly or outside from the electronic assembly.

Inserting the filling material into the cavity may be realized by means of an appropriate filling procedure. Thereby, depending on the viscosity of the filling material (a) potting, i.e. filling without external pressure, and/or (b) molding, i.e. filling supported by an external pressure, can be used in order to insert the filling material into the cavity.

Depending on the specific application an appropriate filling material may be used. Suitable filling materials may be e.g. epoxies, silicones, EMCs (Epoxy Molding Compounds or combinations thereof).

According to a further embodiment of the invention at least a part of the cavity remains unfilled. This may mean that at least a part of the cavity is kept empty and is therefore filled with air.

Leaving at least a part of the cavity empty means that this part of the cavity comprises the lowest possible dielectric constant. As a consequence, the Radio Frequency (RF) performance of the described electronic assembly is increased, which is in particular of advantage in case the electronic assembly is used for RF or other high-frequency applications.

According to a further embodiment of the invention the electronic component is a bare die.

Although the electronic assembly described in this document can generally be used for almost all kinds of electronic components, probably the most benefit from the described invention can be obtained when the electronic assembly comprises a bare die, i.e. a semiconductor chip without a protective housing. Specifically, the base carrier structure and/or the cover carrier structure can provide a sufficient protection for the bare die, which protection is usually given by a semiconductor housing. The semiconductor chip may comprise e.g. GaAs, GaN, Si or any other semiconductor material.

The electronic assembly with the bare die being inserted in its cavity may provide the advantage that the production of the electronic assembly can be realized in an effective manner predominantly on a wafer scale level. This means that bare dies, which have been singularized or individualized from a processed wafer, can be inserted within the cavity by means of an appropriate robot system. Such a robot system can be e.g. a pick and place apparatus comprising an appropriate mounting head for picking up the respective bare die e.g. from a sticky wafer foil and transferring the picked up bare die into the cavity formed within the base carrier structure.

It is mentioned that in case the bare die is a flip chip special care may have to be taken in order to ensure that the flip chip is transferred into the cavity with the correct orientation. In this context it may be necessary that during handling the flip chip with the robot system the orientation of the flip chip is reversed during the transport of the flip chip from the wafer to the respective carrier structure.

According to a further embodiment of the invention the electronic component is a passive electronic component or an active electronic component.

In case the electronic component is a passive electronic component it may be selected from the group consisting of e.g. a capacitor, an inductance, a resistor, and a frequency filter. It is mentioned that this enumeration is not exclusive and also other passive electronic components can be used as the electronic component of the described electronic assembly.

In case the electronic component is an active electronic component it may be selected from the group consisting of a (power) transistor, a voltage converter, an operational amplifier, a power amplifier, a sensor or a digital device such as e.g. a processor, a memory, or a cryptographic component etc. In this respect it is pointed out that also this enumeration is not exclusive.

According to a further embodiment of the invention the printed circuit board and/or the further printed circuit board comprises a structured metallic plane representing at least one of (a) an antenna structure, (b) an EMI shield, (c) thermal conduction element.

With an appropriate antenna structure being formed within one metallic plane being realized by one metallic PCB layer the described electronic assembly can be used in particular for a so called RFID tag which may be used for Near Field Communication (NFC). Such an antenna structure is described for instance in US 2007/0164409 A1 for a standard quad-flat no-leads (QFNs) package. However, this antenna structure is not formed from a PCB metallic layer. Therefore, forming this known antenna structure requires additional process steps (bending of a metal element) and reduces utilization (wasted space for metal element). As a consequence, compared to the solution described in this document the production costs are significantly increased.

An EMI (electromagnetic interference) shield can also be formed from a metallic PCB layer. Thereby, compared to a highly structured or patterned antenna structure the degree of structuring respectively patterning is typically much smaller than with antenna structures. However, for EMI shields the manner how they have to be electrically connected, in particular connected to ground, can be very important. For realizing an effective EMI shield it may be necessary to provide ground connections at different locations of the EMI shield.

Also a thermal conduction element may be formed from a metallic PCB layer. Thereby, it may be beneficial for a good conduction of heat, in particular for a good heat dissipation away from the electronic component towards a given heat sink, that the thermal conduction element has at least a certain thickness. Specifically, since the degree of thermal conduction depends inter alia on the cross section of the thermal conduction element along the path of thermal conduction the dimensions of this cross section should be sufficiently large.

Generally speaking, by providing appropriate metallic structures within PCB metallic layers the described electronic assembly can be realized as a highly complex module, wherein its functionality can be adapted to various specific requirements.

According to a further embodiment of the invention the electronic assembly further comprises connection elements for electrically connecting the electronic component with the base carrier structure and/or with the cover carrier structure.

A connection element may be realized by means of any physical structure exhibiting an appropriate electric conductivity in order to allow for a reliable electrical connection of the electronic component to the "outside world" via the base carrier structure and/or via the cover carrier structure.

Since the electronic component might also be, as has already been explained above, thermally connected to the base carrier structure and/or to the cover carrier structure the shape and the size of the connection elements may depend on the requirements for thermal conductivity. Specifically, the cross section of the respective connection element along the direction of the thermal conducting path should be chosen in such a manner, that a sufficient thermal conduction path is provided.

The connection elements may be e.g. (a) solder bumps, studs or balls, (b) an electric conductive adhesive and/or (c) an electric and thermal conductive adhesive. Other procedures which might be used for connecting the electronic component to the PCB may be the so called flip chipping, stud-bumping, isotropic or anisotropic die attaching, (thermo)sonic bonding, and/or compression bonding.

According to a further embodiment of the invention the electronic assembly further comprises a backside material being attached at a backside of the electronic component.

Depending on the orientation of the electronic component within the cavity, the backside of the electronic component may face the base carrier structure or may face alternatively the cover carrier structure. This means that the backside material described here is located in between the electronic component and the base carrier structure or in between the electronic component and the cover carrier structure.

The backside material may be used for electrically and/or for thermally connecting the backside of the electronic component to the respective portion of the carrier structure. The other side, i.e. the front side, of the electronic component may be used for connecting the electronic component to the other portion of the carrier structure by means of known connection elements as described above.

It is mentioned that during a production of the described electronic assembly the backside material can be attached to the backside of the electronic component at different production stages. For instance, the backside material can already be applied to the backside of the electronic component when the electronic component is still processed at the so-called wafer level. This means that a plurality of electronic components, which might be attached to a sticky wafer foil, are handled together. Thereby, the electronic components may still be connected to each other or the electronic components may already have been individualized. Alternatively or in combination, the backside material can also be applied to the backside of the electronic component when the electronic component has already been placed into the cavity formed within the base carrier structure.

The described backside material may be e.g. (a) a preformed solder material, (b) a B-stage polymer material (i.e. a plastic material, which has not yet been completely cross linked and is therefore still formable), (c) a dispensed polymer material or a so called A-stage polymer material, which has to be applied by means of a cartridge, (d) a dispensed sintering material, and/or (e) any other appropriate material known in the technical field of electronic devices.

According to a further embodiment of the invention the electronic assembly further comprises a solder mask material which covers outer metallic planes of the printed circuit board and/or outer metallic planes of the further printed circuit board.

The described solder mask material, which is quite optional for realizing the electronic assembly described in this document, may provide a (further) mechanical protection for the respective metallic plane and in particular for a structured pattern of the respective metallic plane. The solder mask material may also be present as a remainder from a preceding etching process which has been used for accomplishing the patterning or structuring of the respective metallic plane.

According to a further embodiment of the invention the electronic assembly further comprises a molding compound, which encapsulates at least a portion of the base carrier structure and/or of the cover carrier structure. This may provide the advantage that the described electronic assembly can be realized as an electronic device, which exhibits a high mechanical stability.

It is pointed out that the molding compound can not only encapsulate the base carrier structure and/or the cover carrier structure from the outside, the molding compound can also be used for entering the cavity such that the electronic component, which is disposed within the cavity, gets into direct contact with the molding compound.

According to a further embodiment of the invention the electronic assembly further comprises (a) a further base carrier structure having a further cavity formed therein, (b) a further cover carrier structure, and (c) a further electronic component being disposed within the further cavity and being connected electrically and/or thermally both with the further cover carrier structure and with the further base carrier structure. The further base carrier structure is made at least partially from a further printed circuit board. The further base carrier structure is attached at the cover carrier structure.

The electronic assembly described with this embodiment of the invention may provide the advantage that even a comparatively complex electronic structure or arrangement comprising at least two electronic components can be realized in a simple and effective manner by using known printed PCBs respectively known PCB technology.

Descriptive speaking, the described electronic assembly forms a stack of several carrier structures. Specifically, the stack comprises at least two base carrier structures and at least two cover carrier structures. Thereby, a base carrier structure is attached at a cover carrier structure or alternatively a cover carrier structure is attached at a base carrier structure.

According to a further aspect of the invention there is provided an electronic device comprising an electronic assembly as described above.

The described electronic device may be any arbitrary electronic and/or electric apparatus, which comprises an electronic component, in particular a bare die, which is mechanically protected and/or electrically interconnected by an appropriate carrier structure. The electronic device may be for instance a consumer electronic product, which comprises a highly integrated electronic component being enclosed by the described two-part carrier structure.

In accordance with the invention described in this document the carrier structure, i.e. the base carrier structure and/or the cover carrier structure, comprises a printed circuit board (PCB). This may provide the advantage that known methods and procedures for tooling PCBs can be employed for realizing the electronic assembly being used for the described electronic device.

According to a further aspect of the invention there is provided a method for manufacturing an electronic assembly, in particular an electronic assembly as described above. The provided method comprises (a) providing a base carrier structure, which is made at least partially from a printed circuit board, (b) forming a cavity within the base carrier structure, (c) providing a cover carrier structure, (d) disposing an electronic component within the cavity, and (e) electrically and/or thermally connecting the electronic component both with the cover carrier structure and with the base carrier structure.

Also the described method is based on the idea that an electronic assembly comprising an electronic component, which is mechanically protected by and connected to an appropriate two-part carrier structure, can be produced in an easy and efficient manner if at least the base carrier structure comprises a PCB. This may provide the advantage that basically all processing techniques, which are available for PCBs, can be employed for housing and for electrically connecting the electronic component being disposed within the cavity.

It is pointed out that the described method can be accomplished with a plurality of electronic assemblies, wherein the plurality of electronic assemblies is processed on a wafer scale level until each electronic component is encapsulated and/or interconnected by means of the two-part carrier structure. A separation of the produced electronic assemblies can be carried out at a very late stage of the electronic assembly production. This may provide the advantage that a handling of the plurality of electronic assemblies will be facilitated because the plurality of electronic assemblies can be handled as a single piece.

According to an embodiment of the invention disposing the electronic component within the cavity comprises (a) attaching the electronic component to the cover carrier structure and (b) placing the cover carrier structure with respect to and in particular over or onto the base carrier structure in such an orientation, that the electronic component is disposed within the cavity.

Attaching the electronic component to the cover carrier structure before disposing the electronic component into the cavity may provide the advantage, that the placement of the electronic component can be realized easily and with a high spatial precision.

In this respect it is mentioned that also another electronic component placement procedure are possible, wherein the electronic component is first attached to the base carrier structure by inserting the electronic component within the cavity and then by placing the cover carrier structure on top of the base carrier structure in such a manner that the cavity together with the electronic component being disposed therein is covered and mechanically protected by the cover carrier structure.

It has to be noted that embodiments of the invention have been described with reference to different subject matters. In particular, some embodiments have been described with reference to apparatus type claims whereas other embodiments have been described with reference to method type claims. However, a person skilled in the art will gather from the above and the following description that, unless other notified, in addition to any combination of features belonging to one type of subject matter also any combination between features relating to different subject matters, in particular between features of the apparatus type claims and features of the method type claims is considered as to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

BRIEF DESCRIPTION OF THE DRAWINGS

The invention will be described in more detail hereinafter with reference to examples of embodiment but to which the invention is not limited.

DETAILED DESCRIPTION OF ILLUSTRATED EMBODIMENTS

The illustration in the drawing is represented schematically. It is noted that in different figures, similar or identical elements or features are provided with the same reference signs. In order to avoid unnecessary repetitions, elements or features which have already been elucidated with respect to a previously described figure are not elucidated again at a later position of the description.

Further, spatially relative terms, such as "front" and "back", "above" and "below", "left" and "right", et cetera are used to describe an element's relationship to another element(s) as illustrated in the figures. Thus, the spatially relative terms may apply to orientations in use, which differ from the orientation depicted in the figures. Obviously, though, all such spatially relative terms refer to the orientation shown in the figures for ease of description and are not necessarily limiting as an apparatus according to an embodiment of the invention can assume orientations different than those illustrated in the figures when in use.

Figure 1:
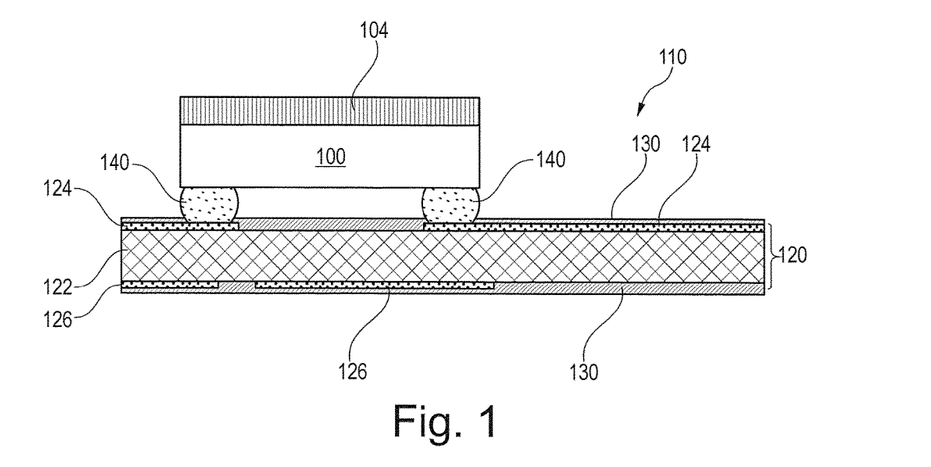
FIG. 1, FIG. 2, FIG. 3 and FIG. 4 illustrate the production of an electronic assembly in accordance with an embodiment of the invention, wherein an electronic component is packaged by means of two carrier structures each comprising a printed circuit board.

FIG. 1 shows the result of a production procedure, with which a first half-finished product for realizing an electronic assembly in accordance with the present invention is produced. As can be seen from FIG. 1, an electronic component 100 is mounted to a carrier structure 110, which, as will be clear from the description below, is called a cover carrier structure 110. According to the embodiment described here, the electronic component is the semiconductor chip 100 and in particular a bare die 100, which means that the semiconductor chip does not include a housing.

The electronic component 100 comprises a backside, which in FIG. 1 is the upper side of the component 100. According to the embodiment described here, an optional backside material 104 is applied at the backside of the electronic component 100. The backside material 104 is predominantly used for grounding the electronic component 100. However, depending on the specific application, the backside material 104 can also be used for electrically connecting the electronic component 100 (e.g. for connecting a third terminal of a transistor) and/or for providing a thermal path for heat, which is generated during an operation of the electronic component 100 and which has to be dissipated or transferred to a non-depicted heat sink.

In accordance with the embodiment described here, the cover carrier structure 110 comprises a printed circuit board 120. The printed circuit board 120 comprises in a known manner a dielectric layer 122 which is sandwiched by two metallic layers 124 and 126. The metallic layers 124 and 126 are structured in order to provide appropriate conductor traces and/or connection pads. In this respect it is mentioned that at least one of the two metallic layers 124 and 126 can be used for presenting other functional elements of the electronic assembly. Such a functional element may be for instance a shield for protecting the electronic component 100 against electromagnetic interference (EMI) generated by an external EMI source. Another functional element, which can be realized by the metallic layer 122 or 126, can be for instance an antenna element. Such an antenna element may be in particular useful in connection with RFID tags. Last but not least, in particular the metallic layer 124 may be used for providing a thermal path for heat which has been generated by the electronic component 100 and which is supposed to be transferred to a heat sink being arranged external of the electronic assembly.

According to the embodiment described here, the electronic component 100 is electrically connected to conductor traces 124 by means of connection elements 140, which, according to the embodiment described here, are realized by solder balls. Of course, also other connection means known in the field may be used. The conductor traces 124 are formed at an upper side of the printed circuit board 120. Further, at the upper side and at the lower side of the printed circuit board 120 there is applied an optional solder mask 130. The solder mask 130 may be a remainder of a previous etching process, with which the metallic layer 126 and/or the metallic layer 124 has been structured in a known manner. However, the solder mask 130 may also be applied intentionally after such an etching process has been completed.

Figure 2:
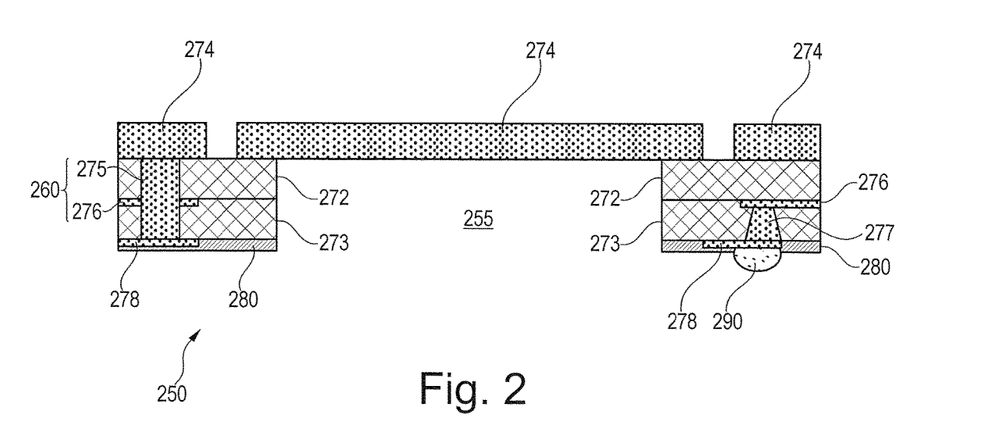

FIG. 2 shows the result of a production procedure, with which a second half-finished product for realizing the electronic assembly in accordance with the present invention is produced. This second half-finished product is a base carrier structure 250 of the electronic assembly. As can be seen from FIG. 2, the base carrier structure 250 comprises the printed circuit board 260, which is a so called multilayer printed circuit board. Accordingly, the multilayer printed circuit board 260 comprises altogether three metallic layers, an upper metallic layer 274, an inner metallic layer 276 and a lower metallic layer 278. Originally, the upper metallic layer 274 and the inner metallic layer 276 are electrically isolated from each other by a dielectric layer 272. Accordingly, originally the metallic layer 276 and the lower metallic layer 278 are electrically isolated from each other by a dielectric layer 273.

As can be seen from FIG. 2, a cavity 255 has been produced by removing (a) center portions of the two dielectric layers 272 and 273 as well as (b) center portions of the metallic layers 276 and 278. According to the embodiment described here, all these portions are aligned such that the cavity 255 comprises even or planar side walls. Of course, also cavities with other geometric forms can be used.

According to the embodiment described here, all metallic layers 274, 276 and 278 are structured in order to form appropriate conductor traces within the respective metallic layer plane. Further, as can be seen from the left side of FIG. 2, portions of the three structured metallic layers 274, 276 and 278 are electrically interconnected by means of a through hole via 275 which is filled with a conductive material. Further, as can be seen from the right side of FIG. 2, a portion of the structured inner metallic layer 276 is electrically connected to a portion of the structured layer 278 by means of a so-called plated through-hole or microvia 277 filled with a conductive material.

As can be further seen from FIG. 2, the upper metallic layer 274 has a thickness, which is much larger than the thickness of the inner metallic layer 276 and the lower metallic layer 278. The reason for forming the upper metallic layer 274 with such a large thickness may be to provide a good thermal connection between the electronic component 100, which in a subsequent production procedure will be placed directly underneath the metallic layer 274, and a non-depicted heat sink being located external to the electronic assembly.

In this respect it is mentioned that for realizing the base carrier structure 250 it is not necessary to use a multilayer printed circuit board. The cavity 255 can also be formed within a single layer printed circuit board. It is further mentioned, that for realizing the base carrier structure 250 also a multilayer printed circuit board comprising more than three layers respectively metallic planes can be used.

In accordance with the printed circuit board 120 shown in FIG. 1 also the printed circuit board 260 can be provided with an optional solder mask material 280. In the embodiment depicted in FIG. 2, such a solder mask material 280 is applied at the lower side of the printed circuit board 260. Further, connection elements may be provided in order to electrically connect the base carrier structure 250 with external electronic circuitries. According to the embodiment described here, such a connection element is realized by means of the solder ball 290.

In this respect it is mentioned that instead of solder ball connection elements also other types of known connection elements or connection procedures may be employed in order to connect the cover carrier structure 110 and/or the base carrier structure 250 with electronic circuitries being outside from the electronic assembly. Such other connection elements may be realized for instance by an adhesive which is electrically conductive and optionally also thermally conductive. Apart from soldering other possible procedures for providing an electrical connection may be e.g. (thermo) sonic bonding and/or compression bonding.

Figure 3:
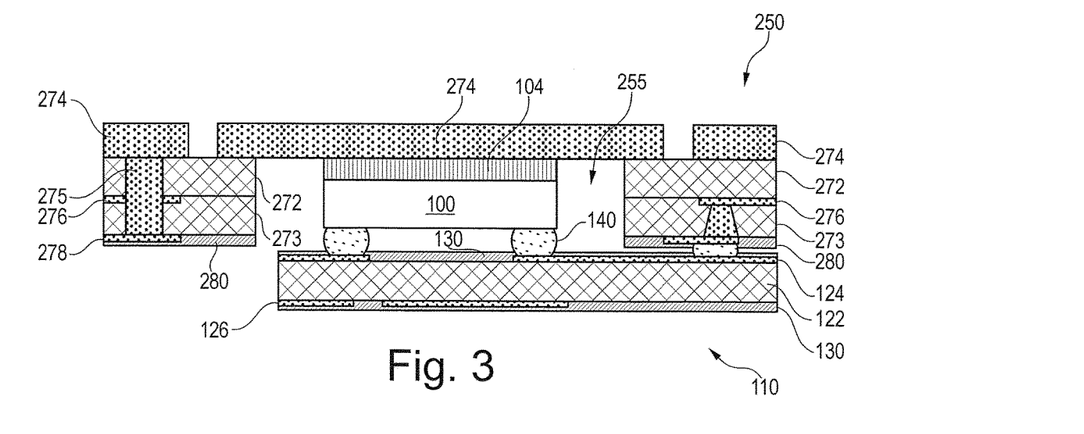

FIG. 3 shows the electronic assembly in a production stage, in which the base carrier structure 250 and the cover carrier structure 110 have been attached to each other in such a manner that the electronic component 100 is located within the cavity 255.

As can be seen from FIG. 3, the cavity 255 is not completely sealed by means of the printed circuit board 120 of the cover carrier structure 110. However, a configuration where the size of the printed circuit board 120 of the cover carrier structure 110 is increased such that the cavity 255 is completely covered by the cover carrier structure 110 is also possible.

FIG. 4 shows the electronic assembly in a further optional production stage, in which a molding compound material 495 is applied to the base carrier structure 250 and to the cover carrier structure 110. The molding compound material 495 may give the electronic assembly a high mechanical stability.

As a consequence of the opening of the cavity 255 shown in FIG. 3, the molding compound material 495 also enters (a) the cavity 255 and also (b) the free space between the lower side of the electronic component 100 and the upper side of the printed circuit board 120. The thickness or the height of this free space is given by the diameter or the height of the solder ball connection elements 140. However, it is clear that in a configuration, where the cavity 255 is completely sealed by the cover carrier structure 110, when applying the molding compound material 495, the empty space within the cavity 255 will remain unfilled. Such a configuration may be in particular useful if the electronic assembly is used for radio frequency (RF) applications, because a free space, which will be filled with air, has the lowest possible dielectric constant. As a consequence, the efficiency of such an RF electronic assembly can be significantly increased. This holds in particular when the electronic assembly comprises an antenna pattern being formed by means of an appropriate structuring of a metallic layer of the printed circuit board 120 of the cover carrier structure 110 and/or of the printed circuit board 260 of the base carrier structure 250.

It should be noted that the term "comprising" does not exclude other elements or steps and the use of articles "a" or "an" does not exclude a plurality. Also elements described in association with different embodiments may be combined. It should also be noted that reference signs in the claims should not be construed as limiting the scope of the claims.

Figure 5:
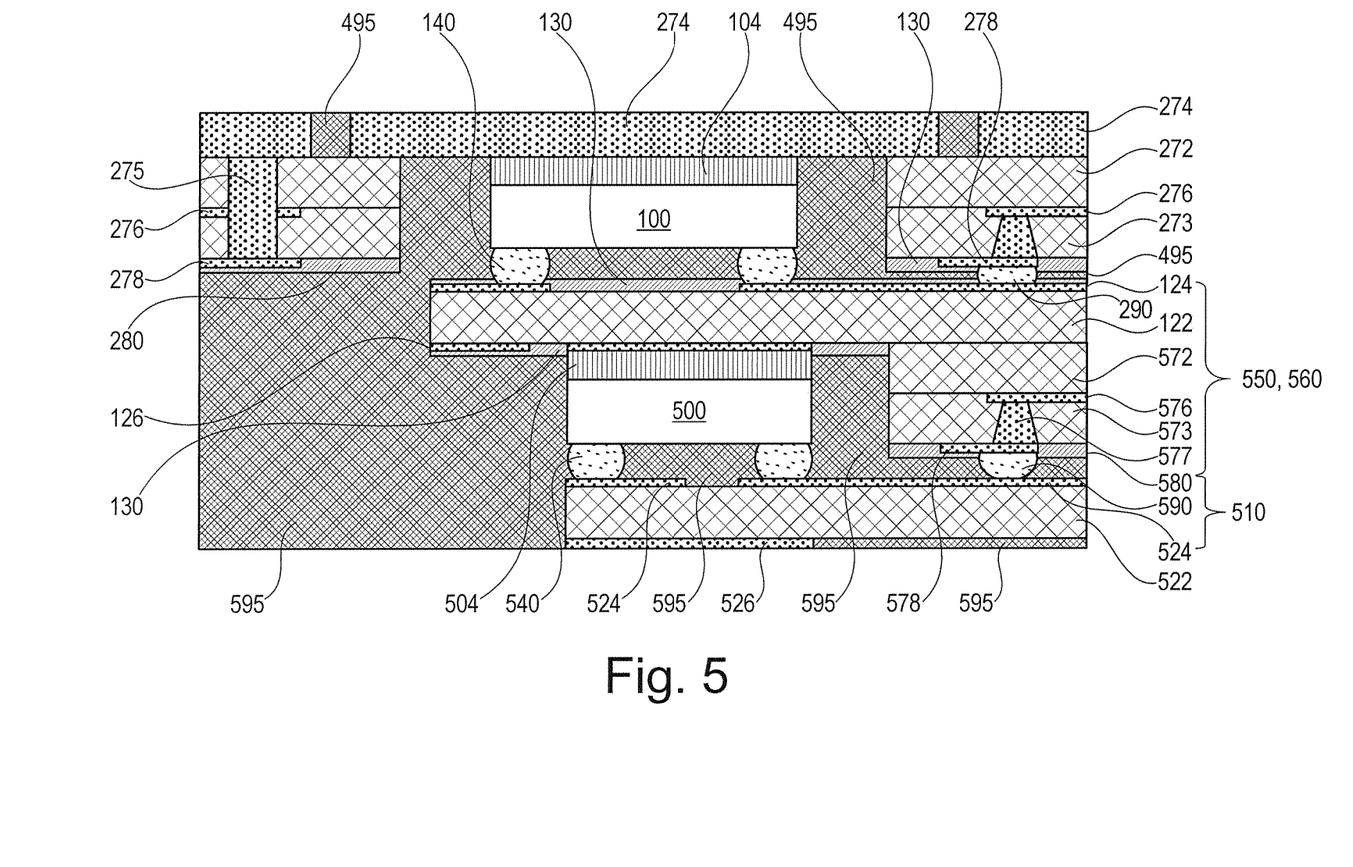
FIG. 5 shows an electronic assembly in accordance with a further embodiment of the invention, where two packaged electronic components are arranged in a stacked manner.

FIG. 5 shows an electronic assembly in accordance with a further embodiment of the invention. In this electronic assembly two packaged electronic components 100, 500 are arranged in a stacked manner. In other words, this electronic assembly comprises two electronic assemblies of the type shown in FIG. 4.

As can be seen from FIG. 5, apart from the lowest layer part of the molding compound material 495 the upper part of the electronic assembly corresponds to the electronic assembly of FIG. 4.

In addition to the electronic assembly of FIG. 4 this electronic assembly (of FIG. 5) comprises a further electronic component 500. According to the embodiment described here, also the further electronic component is a semiconductor chip 500 and in particular a bare die 500.

The further electronic component 500 comprises a backside, which in FIG. 5 is the upper side of the component 500. According to the embodiment described here, an optional backside material 504 has been applied at the backside of the electronic component 500. The function of the backside material 504 is the same as the function of the backside material 104 elucidated above.

The further electronic component 500 is attached to the structured metallic layer 126 from the bottom side of FIG. 5. According to the embodiment described here, the optional backside material 504 is arranged between the upper surface of the further electronic component 500 and the structured metallic layer 126.

The electronic assembly of FIG. 5 further comprises two dielectric layers 572 and 573, which are attached at the bottom side of the dielectric layer 122. In between the two dielectric layers 572 and 573 there is formed a structured metallic layer 576 similar to the structured metallic layer 276, Within the dielectric layer 573 there is formed a plated through hole or microvia 577 being filled with a conductive material for interconnecting the structured metallic layer 576 with a structured metallic layer 578. At the bottom surface of the dielectric layer 573 there is formed, within some surface portions, an optional solder mask material 580. This solder mask material 580 corresponds to the solder mask material 280 of the base carrier structure 250 depicted in FIG. 2. At the bottom side of the structured metallic layer 578 there is formed a connection element 590. According to the exemplary embodiment described here this connection element is realized by means of a solder ball 590.

From a comparison of FIG. 5 with FIG. 2 one can recognize that the structure comprising the structured metallic layer 126, the two dielectric layers 572 and 573, the structured metallic layers 576 and 578, the metallic interconnection 577, the connection element 590, and the optional solder mask material 580 corresponds to the base carrier structure 250. Therefore, this structure can be denominated a further base carrier structure 550 or a further (multilayer) printed circuit board 560.

By contrast to the base carrier structure 250 the further base carrier structure 550 does not comprise a cavity similar to the cavity 255. The further base carrier structure 550 only forms a half open cavity, which accommodates the electronic component 500.

As can be seen from FIG. 5, the electronic component 500 is electrically connected to a further cover carrier structure 510 by means of connection elements 540. According to the exemplary embodiment described here also these connection elements are realized by means of solder balls 540. In accordance with the cover carrier structure 210 the further cover carrier structure 510 comprises a dielectric layer 522, and two structured metallic layers 524 and 526 sandwiching the dielectric layer 522 in between.

According to the exemplary embodiment described here the optional molding compound material 495 shown in FIG. 4 is extended or enlarged with an optional further molding compound material 595. Preferably, the molding compound material 495 and the further molding compound material 595 are applied or formed simultaneously. In this case the molding compound material 495 and the further molding compound material 595 are one and the same material.

Figure 6:
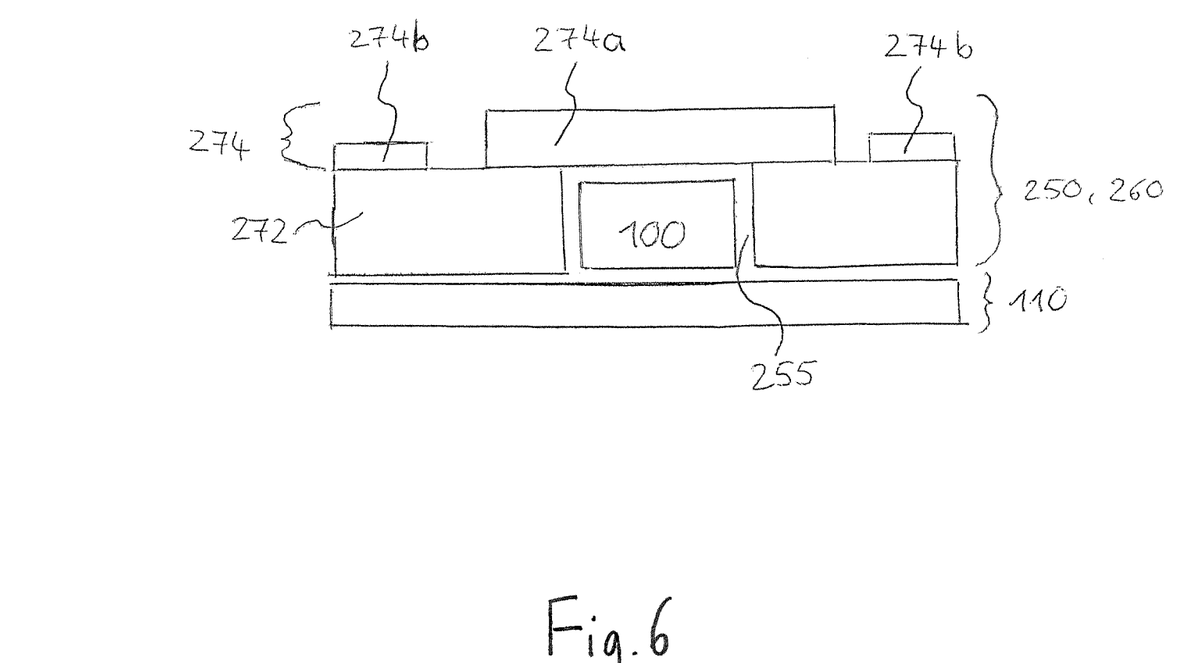
FIG. 6 shows an electronic assembly in accordance with a further embodiment of the invention, where a structured metallic plane of the base carrier structure comprises different portions being, wherein a first portion is used for heat dissipation purposes and a second portion is used for electrical connection purposes.

FIG. 6 shows an electronic assembly in accordance with a further embodiment of the invention. The electronic assembly comprises a cover carrier structure 110, a base carrier structure 250, and an electronic component being accommodated within a cavity 255 formed within the base carrier structure 250.

According to the exemplary embodiment described here the base carrier structure 250 is realized by a printed circuit board 260. The printed circuit board 260 is a co called single layer circuit board which comprises a dielectric layer 272 and a structured metallic layer respectively a structured metallic plane 274. The structured metallic plane 274 comprises different portion being formed over the surface of the metallic plane 274. Specifically, the structured metallic plane 274 comprises a first portion 274a being located over the cavity 255 respectively the electronic component 100. Second surface portions 274b are located adjacent to the first portion 274a. The first portion 274a is used solely for conducting heat being generated by the electronic component 100 to the outside. The second portions 274b are used for electric connection purposes. Specifically, the second portions 274b are used for electrically connecting non depicted other electric (active or passive) components being external the described electronic assembly. Such external components can be assigned for instance to a main board onto which the described electronic assembly is placed.

It is mentioned that electric connections within the illustrated electronic assembly can be realized in various manners. In particular in one embodiment an electric connection between the first portion 274a and/or the second portion 274b and the non-depicted metallic plane of the cover carrier structure 110 being realized by printed circuit board. Further connections to other non-depicted metallic planes or metallic layers are also possible.

LIST OF REFERENCE SIGNS 100 electronic component/semiconductor chip/bare die
104 backside material
110 cover carrier structure
120 (further) printed circuit board
122 dielectric layer
124 structured metallic layer/conductor traces
126 structured metallic layer/conductor traces
130 solder mask material/solder mask layer
140 connection elements/solder balls
250 base carrier structure
255 cavity
260 printed circuit board
272 dielectric layer
273 dielectric layer
274 thick structured metallic layer/conductor traces
275 through hole via
276 structured metallic layer/conductor traces
277 metallic interconnection/microvia
278 structured metallic layer/conductor traces
280 solder mask material/solder mask layer
290 connection element/solder ball
495 molding compound material
500 further electronic component/semiconductor chip/bare die
504 backside material
510 further cover carrier structure
522 dielectric layer
524 structured metallic layer/conductor traces
526 structured metallic layer/conductor traces
540 connection elements/solder balls
550 further base carrier structure
560 further printed circuit board
572 dielectric layer
573 dielectric layer
576 structured metallic layer/conductor traces
577 metallic interconnection/microvia
578 structured metallic layer/conductor traces
580 solder mask material/solder mask layer
590 connection element/solder ball
595 further molding compound material

The invention claimed is:

1. An electronic assembly, comprising:
a base carrier structure having a cavity formed therein,
a cover carrier structure, and
an electronic component being disposed within the cavity and being connected electrically and/or thermally both with the cover carrier structure and with the base carrier structure,
wherein the base carrier structure is made at least partially from a printed circuit board, and
wherein the printed circuit board is a circuit board comprising at least one dielectric layer and at least one structured metallic plane for thermally connecting the electronic component.

2. The electronic assembly of claim 1, wherein the at least one structured metallic plane is further configured for electrically connecting the electronic component.

3. The electronic assembly of claim 1, wherein a first portion of the structured metallic plane is configured for thermally connecting the electronic component and a second portion of the structured metallic plane is configured for electrically connecting at least one external electronic component.

4. The electronic assembly of claim 1, wherein the cover carrier structure is made at least partially from a further printed circuit board.

5. The electronic assembly of claim 1, wherein the printed circuit board and/or the further printed circuit board is a circuit board comprising at least two more or less structured metallic planes and at least one dielectric layer being formed between two neighboring metallic planes.

6. The electronic assembly of claim 1, further comprising:
a filling material, which is located within the cavity.

7. The electronic assembly of claim 1, wherein at least a part of the cavity remains unfilled.

8. The electronic assembly of claim 1, wherein the electronic component is a bare die.

9. The electronic assembly of claim 1, wherein the electronic component is a passive electronic component or an active electronic component.

10. The electronic assembly of claim 1, wherein the printed circuit board and/or the further printed circuit board comprises a structured metallic plane representing at least one of (a) an antenna structure, (b) an EMI shield, (c) thermal conduction element.

11. The electronic assembly of claim 1, further comprising:
connection elements for electrically connecting the electronic component with the base carrier structure and/or with the cover carrier structure.

12. The electronic assembly of claim 1, further comprising:
a backside material being attached at a backside of the electronic component.

13. The electronic assembly of claim 1, further comprising:
a solder mask material which covers outer metallic planes of the printed circuit board and/or of the further printed circuit board.

14. The electronic assembly of claim 1, further comprising:
a further base carrier structure having a further cavity formed therein,
a further cover carrier structure, and
a further electronic component being disposed within the further cavity and being connected electrically and/or thermally both with the further cover carrier structure and with the further base carrier structure, wherein the further base carrier structure is made at least partially from a further printed circuit board, and wherein the further base carrier structure is attached at the cover carrier structure.

15. An electronic device, comprising:

an electronic assembly including a base carrier structure having a cavity formed therein, a cover carrier structure, and an electronic component disposed within the cavity and connected electrically and/or thermally both with the cover carrier structure and with the base carrier structure, wherein the base carrier structure is made at least partially from a printed circuit board, and wherein the printed circuit board is a circuit board comprising at least one dielectric layer and at least one structured metallic plane for thermally connecting the electronic component.

16. A method for manufacturing an electronic assembly, the method, comprising:

providing a base carrier structure, which is made at least partially from a printed circuit board, forming a cavity within the base carrier structure, providing a cover carrier structure, disposing an electronic component within the cavity, and electrically and/or thermally connecting the electronic component both with the cover carrier structure and with the base carrier structure, wherein the printed circuit board is a circuit board comprising at least one dielectric layer and at least one structured metallic plane for thermally connecting the electronic component.

17. The method of claim 16, wherein disposing the electronic component within the cavity comprises attaching the electronic component to the cover carrier structure and placing the cover carrier structure with respect to the base carrier structure in such an orientation, that the electronic component is disposed within the cavity.

* * * * *